(12) United States Patent
Salem et al.

(10) Patent No.: US 9,733,307 B1
(45) Date of Patent: Aug. 15, 2017

(54) OPTIMIZED CHAIN DIAGNOSTIC FAIL ISOLATION

(71) Applicant: International Business Machines Corporation, Armonk, NY (US)

(72) Inventors: Gerard M. Salem, Essex Junction, VT (US); Andrew A. Turner, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/298,699

(22) Filed: Oct. 20, 2016

(51) Int. Cl.
  *G01R 31/28* (2006.01)
  *G01R 31/317* (2006.01)
  *G01R 31/3177* (2006.01)

(52) U.S. Cl.
  CPC ... *G01R 31/31723* (2013.01); *G01R 31/3177* (2013.01); *G01R 31/31703* (2013.01)

(58) Field of Classification Search
  None
  See application file for complete search history.

(56) References Cited

U.S. PATENT DOCUMENTS

| | | | |
|---|---|---|---|
| 5,991,909 A | 11/1999 | Rajski et al. | |
| 6,360,342 B1 | 3/2002 | Lee et al. | |
| 7,103,814 B2 | 9/2006 | Corbin et al. | |
| 7,234,090 B2 | 6/2007 | Blasi et al. | |
| 7,263,642 B1 | 8/2007 | Makar et al. | |
| 7,502,979 B2 | 3/2009 | Dastidar | |
| 7,568,141 B2 | 7/2009 | Menon et al. | |
| 7,627,798 B2 | 12/2009 | Kiryu | |
| 8,112,686 B2 | 2/2012 | Hapke et al. | |
| 8,862,954 B1 * | 10/2014 | Wang | G01R 31/318552 714/731 |
| 9,250,287 B2 | 2/2016 | Mukherjee et al. | |

(Continued)

FOREIGN PATENT DOCUMENTS

JP    2006302470 A    11/2006

OTHER PUBLICATIONS

Anonymously; "Method and Apparatus to Debug Simulation Failures for [On-Chip] Scan Compression Patterns"; An IP.com Prior Art Database Technical Disclosure; IP.com No. IPCOM000185968D; IP.com Electronic Publication Date: Aug. 3, 2009; pp. 6.

(Continued)

*Primary Examiner* — Daniel McMahon
(74) *Attorney, Agent, or Firm* — Cantor Colburn LLP; Steven Meyers

(57) ABSTRACT

A method, system, and/or computer program product of scanning of an integrated circuit including chiplets to isolate fault locations is provided herein. The scanning of the integrated circuit includes providing, by a pervasive of the integrated circuit, an input to the chiplets. Each of the chiplets can include a pervasive satellite, a multiplexer, and latches. The scanning of the integrated circuit includes also scanning, by each pervasive satellite of the chiplets, data based on the input via the multiplexer into the latches to produce scan data for each of the chiplets. The scanning of the integrated circuit also includes comparing, by the pervasive of the integrated circuit, the scan data of each of the chiplets to expectant data stored on the pervasive to isolate the fault locations.

11 Claims, 6 Drawing Sheets

(56) References Cited

U.S. PATENT DOCUMENTS

| | | | |
|---|---|---|---|
| 2002/0138801 A1* | 9/2002 | Wang | G01R 31/31704 714/729 |
| 2004/0153926 A1* | 8/2004 | Abdel-Hafez | G01R 31/318385 714/726 |
| 2004/0237015 A1* | 11/2004 | Abdel-Hafez | G01R 31/318591 714/726 |
| 2005/0055617 A1* | 3/2005 | Wang | G01R 31/318335 714/727 |
| 2005/0229057 A1 | 10/2005 | Anderson et al. | |
| 2005/0262409 A1* | 11/2005 | Wang | G01R 31/318342 714/738 |
| 2006/0048028 A1 | 3/2006 | Blasi et al. | |
| 2006/0190668 A1* | 8/2006 | Biran | G06F 13/4059 710/315 |
| 2008/0052579 A1* | 2/2008 | Riley | G01R 31/318575 714/731 |
| 2008/0189583 A1 | 8/2008 | Andersone | |
| 2009/0089636 A1* | 4/2009 | Fernsler | G06F 11/2242 714/728 |
| 2009/0210762 A1* | 8/2009 | Wang | G01R 31/318547 714/729 |
| 2014/0143623 A1* | 5/2014 | Touba | G01R 31/318547 714/728 |

OTHER PUBLICATIONS

IBM; et al.:"On-chip Test Structure"; IP.com No. IPCOM000169987D; Original Publication Date: May 5, 2008; pp. 5.

* cited by examiner

OPTIMIZED CHAIN DIAGNOSTIC FAIL ISOLATION

In general, scan chains are techniques used for testing logic of an integrated circuit. An integrated circuit (also referred to as an IC, a chip, a microchip, a microprocessor, etc.) is a set of electronic circuits, such as latches, flip-flops, etc., on a semiconductor plate configured for specific or general purpose processing. Scan chains provide a way to set and observe the electronic circuits of the integrated circuit to test the logic of the integrated circuit.

For instance, latches can be arranged serially, such that a value can be scanned in serially across a scan chain during a test, while any data can be loaded directly into the latches. However, because the only observables of the scan chain are outputs (i.e., the interior of the scan chain is unobservable without scanning out or additional equipment) and a single break inside the scan chain causes a stuck fault (i.e., renders all 0s or 1s because every bit went through the defect), any break in the scan chain is difficult to detect. In this way, scan chain diagnostic tests can be error prone, time consuming, or inaccurate (e.g., scan chain diagnostic tests are inadequate in isolating noise/droop sensitive fails). Contemporary tests, such as general scan design (GSD) scan tests or logic built-in self-tests (LBIST), attempt to resolve these shortcomings.

For example, GSD scan tests pick a single "good" condition where a chain is loaded, a voltage is lowered, two shifts are performed, and a voltage is raised. Then, data is scanned out, and any deviations can indicate fails. GSD scan tests may a high granularity, but they have a low speed, constant noise, and rings must be fully scanned out for each test. Additionally, GSD scan tests require a tester (e.g., cannot be executed automatically).

As another example, LBIST can perform scan tests to generate lots of noise, but noise is not fully configurable (e.g., worse than functional mode), has poor diagnostic granularity, and is difficult to turn off. LBIST also require a tester.

Thus, an on-chip diagnostic mechanism that overcomes the shortcomings of contemporary tests, by determining where a breakage occurs and diagnosing the problem, is desirable.

SUMMARY

According to one embodiment, a method of scanning of an integrated circuit comprising one or more chiplets to isolate one or more fault locations is provided. The method comprises providing, by a pervasive of the integrated circuit, an input to the one or more chiplets, each of the one or more chiplets comprising a pervasive satellite, at least one multiplexer, and one or more latches; scanning, by each pervasive satellite of the one or more chiplets, data based on the input via the at least one multiplexer into the one or more latches to produce scan data for each of the one or more chiplets; and comparing, by the pervasive of the integrated circuit, the scan data of each of the one or more chiplets to expectant data stored on the pervasive to isolate the one or more fault locations. According to other embodiments, the method can be implemented by a system or computer program product.

Additional features and advantages are realized through the techniques of the present disclosure. Other embodiments and aspects of the disclosure are described in detail herein.

For a better understanding of the disclosure with the advantages and the features, refer to the description and to the drawings.

BRIEF DESCRIPTION OF THE DRAWINGS

The subject matter is particularly pointed out and distinctly claimed in the claims at the conclusion of the specification. The forgoing and other features, and advantages of the embodiments herein are apparent from the following detailed description taken in conjunction with the accompanying drawings in which:

DETAILED DESCRIPTION

The disclosure relates generally to optimized chain diagnostic fail isolation, and more particularly to an on-chip diagnosis and fail analysis of scan fails within a scan chain of an integrated circuit, along with fail mitigation. Embodiments disclosed herein may include diagnosis system, method, and/or computer program product (herein diagnosis system) that comprises an integrated circuit, a plurality of scan chains of the integrated circuit, and a shift engine internal to the integrated circuit. The shift engine can perform parallel writes shifts and to a data set to discover fails (fault locations) in the plurality of scan chains. The diagnosis system can further stash fail data aside for processing/unloading.

Figure 1:
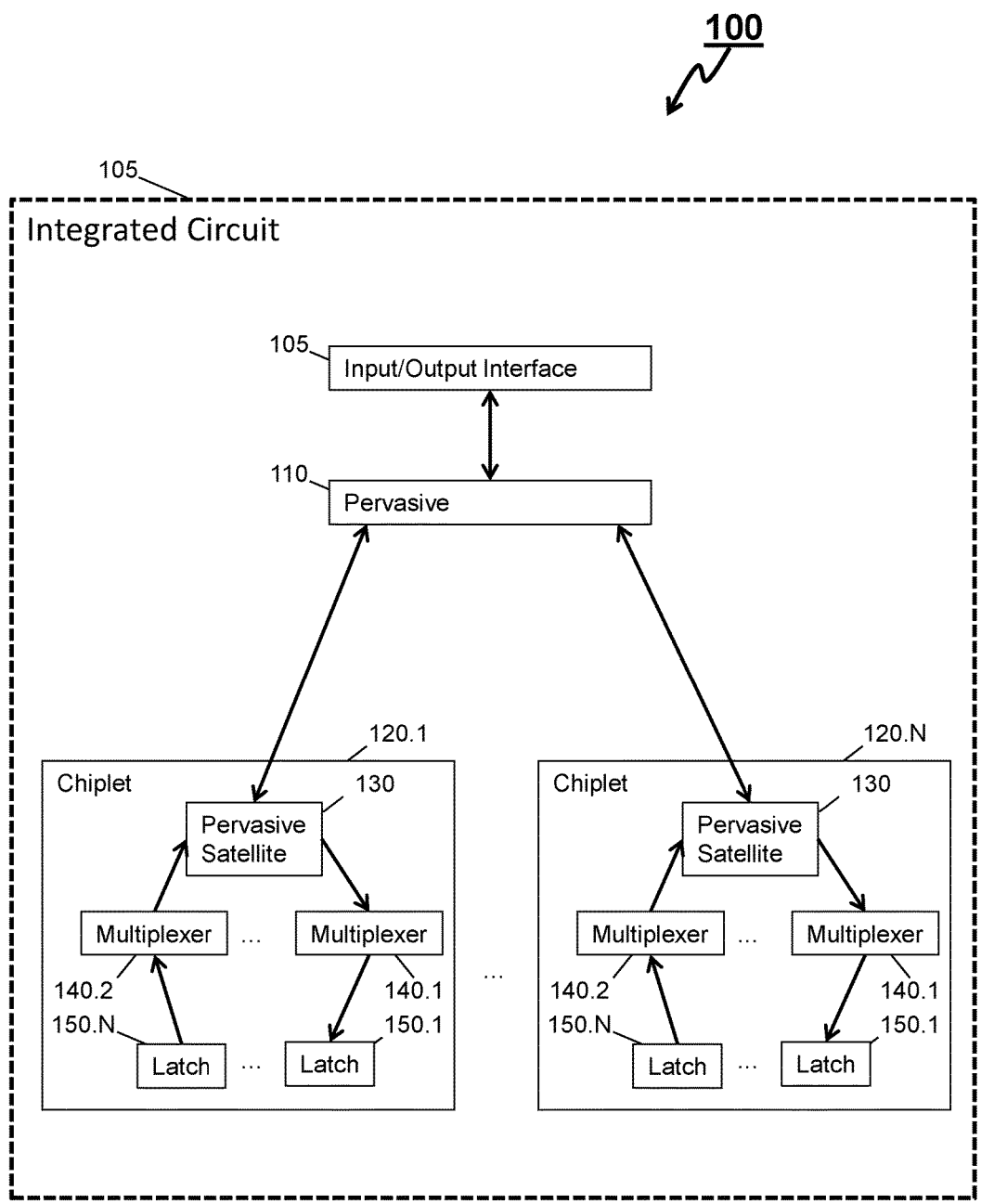
FIG. 1 illustrates an architecture of a diagnosis system in accordance with another embodiment.

Turning now to FIG. 1, a diagnosis system 100 is provided in accordance with an embodiment. The diagnosis system 100 comprises an integrated circuit 101. The diagnosis system 100 sets a configuration of the integrated circuit 101. The configuration includes setting the integrated circuit 101 for a scan (e.g., endpoint, clock controllers, etc.), setting an internal clock frequency, and setting a scan ratio. The diagnosis system 100 can perform shifts and compares within the integrated circuit 101 in parallel and can store miscompare data for future unload (fail data is stored on chip for eventual unloading by a tester or system). In a non-limiting embodiment, the diagnosis system 100 can be a high level pervasive scan architecture over the integrated circuit 101 and components therein (which are hardware subparts).

The integrated circuit 101 comprises an input/output interface 105, a pervasive 110, and one or more chiplets 120 (represented by 120.1-120.N where N is an integer greater than 0). The input/output interface 105 enables signals and communications to be sent to and received from the pervasive 110. The pervasive 110 can be circuitry of the diagnosis system 100 that supports hardware/software operations for controlling and testing the remaining portion on the diagnosis system 100. The pervasive 110 comprises a scan buffer for storing data (e.g., an expectant pattern described herein). The pervasive 110 operates to dispatch commands to the one or more chiplets 120.

The one or more chiplets 120 can be a hierarchical circuitry designation of the diagnosis system 100. The one or more chiplets 120 can align with one or more cores of the integrated circuit 101. In an embodiment, the one or more chiplets 120 can be defined by one or more rings (described herein) and/or an arbitrary line designated by the diagnosis system 100. Each chiplet 120 can comprise a pervasive satellite 130, one or more multiplexers 140 (represented by 140.1-140.2), and one or more latches 150 (represented by 150.1-150.N where N is an integer greater than 0). The pervasive satellite 130 comprises a scan buffer for storing data and reading and writing to the one or more latches 150 (e.g., a scan pattern to test the one or more latches 150 described herein).

The one or more latches 150 can also be referred to as random measure latches, random observe/control latches, etc. The one or more latches 150 of the integrated circuit 101 can be controlled individually. The one or more latches 150 can be serially aligned by the diagnosis system 100 into one or more rings and/or a scan chain. A ring is a set of latches of a scan chain from an input pin to an output pin. The scan chain can comprise multiple rings in parallel rings, where each ring starts at different input pin (e.g., to enable the selection of multiple rings). Parallel rings can also be defined as rings of a parallel chiplets 120.

Figure 2:
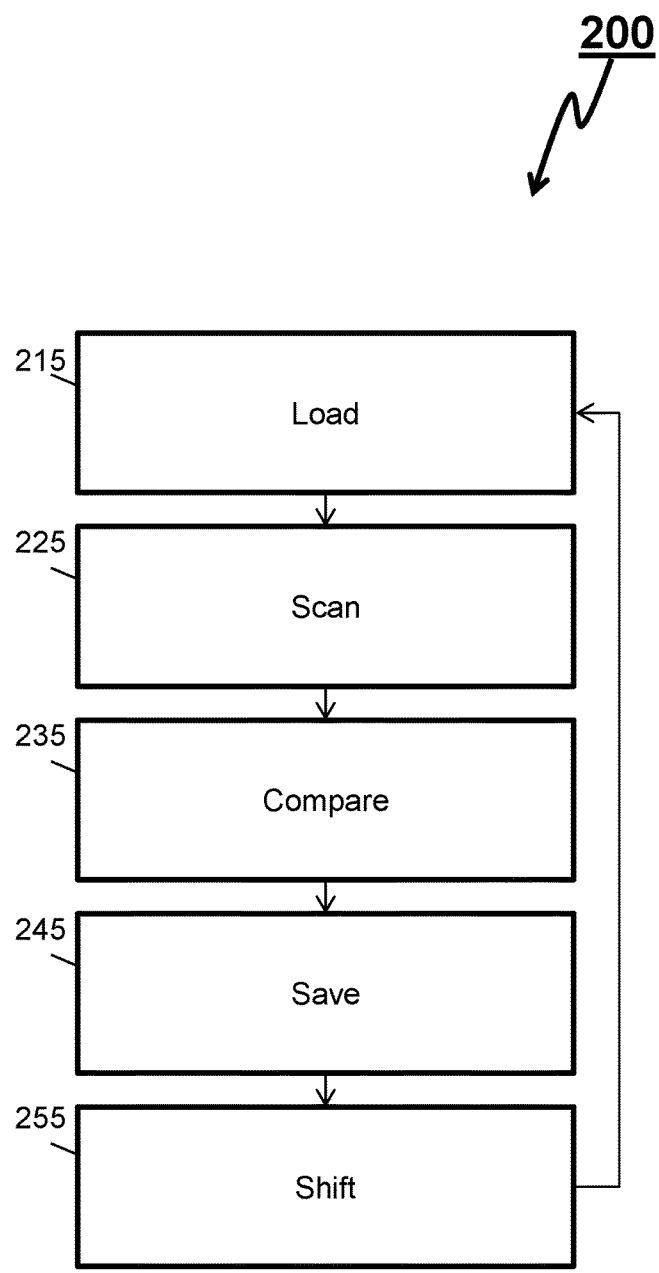
FIG. 2 illustrates a process flow of a diagnosis system in accordance with another embodiment.

Turning now to FIG. 2, a non-limiting example operation as shown by a process flow 200 of the diagnosis system 100 is provided in accordance with an embodiment. The process flow 200 begins at block 215, where the diagnosis system 100 can load the one or more latches 150 of the integrated circuit 101 with data. Loading the one or more latches 150 with the data is a portion of a scanning of the integrated circuit 101 to isolate one or more fault locations. The data can be based on the expected pattern of the pervasive 110. To load the data, the diagnosis system 100 provides an input (e.g., signal or value) via the input/output interface 105 and the pervasive 110, to the pervasive satellite 130. For instance, the pervasive satellites 130 operate to receive dispatch commands from the pervasive 110.

At block 225, the diagnosis system 100 utilizes the one or more multiplexers 140 scan the data into the one or more latches 150. For example, the data is scanned from the pervasive satellite 130 through the multiplexer 140.1 to the latches 150.1-150.N. Further, output data (e.g., scan data) is scanned out from the latches 150.1-150.N through the multiplexer 140.2 to the pervasive satellite 130 in accordance with how the latches receive the data. The output data can be stored in the scan buffer of the pervasive satellite 130.

In a non-limiting embodiment, the data can be scan signals produced by the clock. The clock can produce the scan signals as a designed noise comprising making a cadence and a volume based on a rate of change (e.g., values propagating through the latches). In this way, noise frequency and amplitude are configurable by customizing the data, so that clock sequences better reflect functional use of the integrated circuit. In an embodiment, the clock can generate high frequency noise (e.g., 1-0-1-0-1-0-1-0-1). In a non-limiting embodiment, the diagnosis system 100 bumps to low voltage after a specific count of cycles, bumps-down, shifts N cycles, and bumps-up. Further, the diagnosis system 100 can shift before the bump to draw a significant current. Note that stopping abruptly can cause an overshoot, lowering the voltage at the same time to amplify a droop, and performing shifts in this droop can isolate the most noise sensitive latches. In another embodiment, the clock can also generate low to middle frequency noise (e.g., 1-1-1-1-0-1-1-1-1-0-1-1-1-1-0-1-1-1-1-0-1-1-1-1). In a non-limiting embodiment, the clock can generate high frequency noise for a first and a scan chain for middle frequency noise or scan chains adjacent to the first scan chain. For example, the low to middle frequency noise can be initiated as a long scan on adjacent chains before performing the initial bump. In another embodiment, the clock can also perform multicasts (e.g., scan an amount of work simultaneously). The clock can perform multicast scans to create noise.

At block 235, the diagnosis system 100 can compare the scan data with the expectant data. Comparing the scan data with the expectant data is another portion of a scanning of the integrated circuit 101 to isolate the one or more fault locations. This comparing can be performed in the chiplet 120 or the pervasive 105. When comparing the scan data to the expect data, a value is read and compared from the scan buffer in the pervasive satellite 130 to the scan buffer in the pervasive 110. The expected pattern (also referred to as the expectant data) can indicate whether the one or more latches 150 (e.g., the one or more rings and/or the scan chain) is working correctly or whether and where the scan chain is broken (a fault location). For example, a fault location can be represented as fail data, which is associable to an appropriate failing latch positions detected by number of shifts performed before stress/bump cycles.

In a non-limiting embodiment, a compare operation can be executed by XORing data on the ring (the output data) to what is in the scan buffer (expected data), such that whether the XORing is true or not indicates whether the data changes (i.e., the one or more fault locations). By identifying the one or more fault locations, the diagnosis system 100 enables a physical analysis of the integrated circuit 101 at the one or more fault locations.

At block 245, the diagnosis system can perform a save operation that stores the output data, any identified fault location, etc. For instance, where a fault location is identified, the scan data, chiplet/satellite identification, source shift count, and experiment identification is stored. This storing can be performed in the chiplet 120 or the pervasive 110.

At block 255, the input by the diagnosis system 100 can cause scan shifts to be performed in the one or more chiplets 120 across the one or more latches 150. For example, the diagnosis system 100 can utilize an internal shift engine comprising a clock and the scan buffers of the integrated circuit 101 working together to perform parallel writes (which render multiple sets of output data). Parallel writes comprise when buffers are utilized to manage multiple rings of the scan chain. Parallel writes can cause the multiple rings to receive individual inputs at the same time and render separate output data. The clock manages a scan clock to initiate and control the rotation of one or more rings of a scan chain (e.g., the scan chain that is 80 latches long can include a first ring that is shifted from Latch 150.1 and to Latch 150.2).

Figure 3:
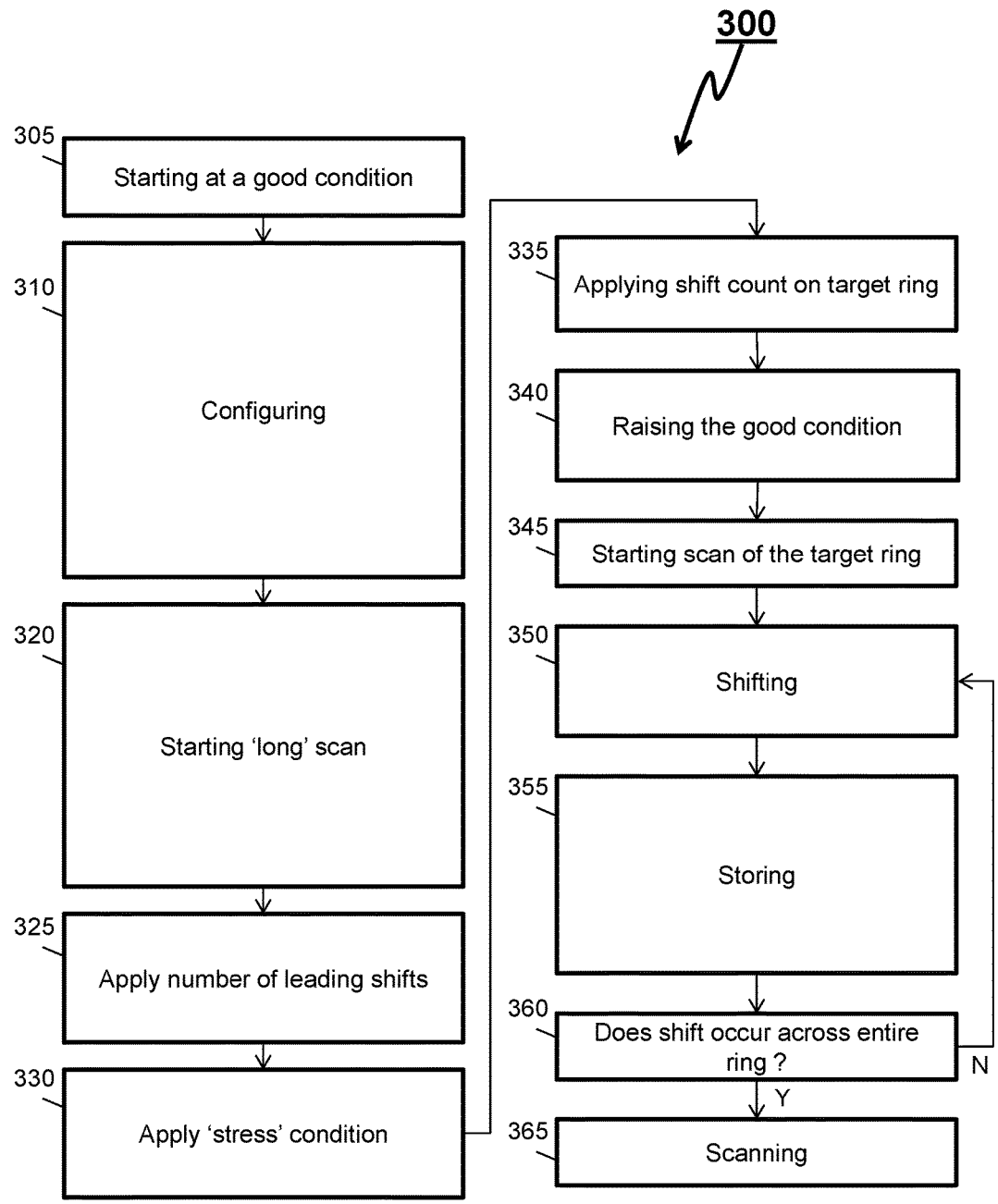
FIG. 3 illustrates another process flow of a diagnosis system in accordance with another embodiment.

Turning now to FIG. 3, a process flow 300 of a diagnosis system is provided in accordance with an embodiment. The process flow 300 can be a single (focused) scan chain mode that begins at block 305. At block 305, the diagnosis system starts at a known good condition within an integrated circuit. That is, the diagnosis system locates a latch along the single scan chain that is not broken to identify a target ring.

At block 310, the diagnosis system configures the integrated circuit for a scan. The diagnosis system can set the integrated circuit for the scan (e.g., endpoint, clock controllers, etc.), set an internal clock frequency, and set a scan ratio. The diagnosis system can set a compare mask, comparison value, and comparison type. The diagnosis system can configure pervasive memory of the integrated circuit with an expect pattern. Note that each expect pattern produces a different noise profile, and how the noise profiles aligns indicates fault locations.

At block 320, the diagnosis system starts a long scan. The long scan can continue through completion of block 330 for stable noise (or just before block 330 for droop on other chains to produce supply noise). At block 325, the diagnosis system applies number of leading shifts to the long scan (e.g., higher number can cause more overshoot of the fault location). At block 330, the diagnosis system applies stress condition to the long scan. Stress conditions are programmed as a sequence of events to produce desired noise and diagnostic isolation. For example, in a single chain, shift ring 500 times, change scan ratio (quickly), and shift twice. Note that the separation between block 320 and block 330 is short to the stress condition is within a noise event. At block 335, the diagnosis system applies shift count on the target ring. At block 340, the diagnosis system can raise the good condition determined at block 305 (i.e., move the good condition along the single scan chain).

At blocks 345 and 350, the diagnosis system starts scan of the target ring and shifts a buffer width a number of cycles. During the shift, the target ring renders output data that is stored in the scan buffer of the pervasive. The output data can be compared to the expect pattern of block 310. Note that the shift can be less than the width of the scan buffer to avoid looping back through the single scan chain or losing an ability to diagnose fails. At block 355, if any bit does not compare, the diagnosis system stores a copy of the scan buffer in the pervasive with the target ring identification and a total shift count.

At block 360, the diagnosis system determines whether the shift occurs across entire target ring. If the shift occurs across the entire target ring, the process proceeds to block 365 (as indicated by the 'Y' Arrow). Otherwise, the process proceeds to block 350 (as indicated by the 'N' Arrow). At block 365, the diagnosis system scans only fail data out of the integrated circuit (from the fail location). For example, on a fail loop fail data is read. Two loops may be required if too many pre-bump shifts are used.

Figure 4:
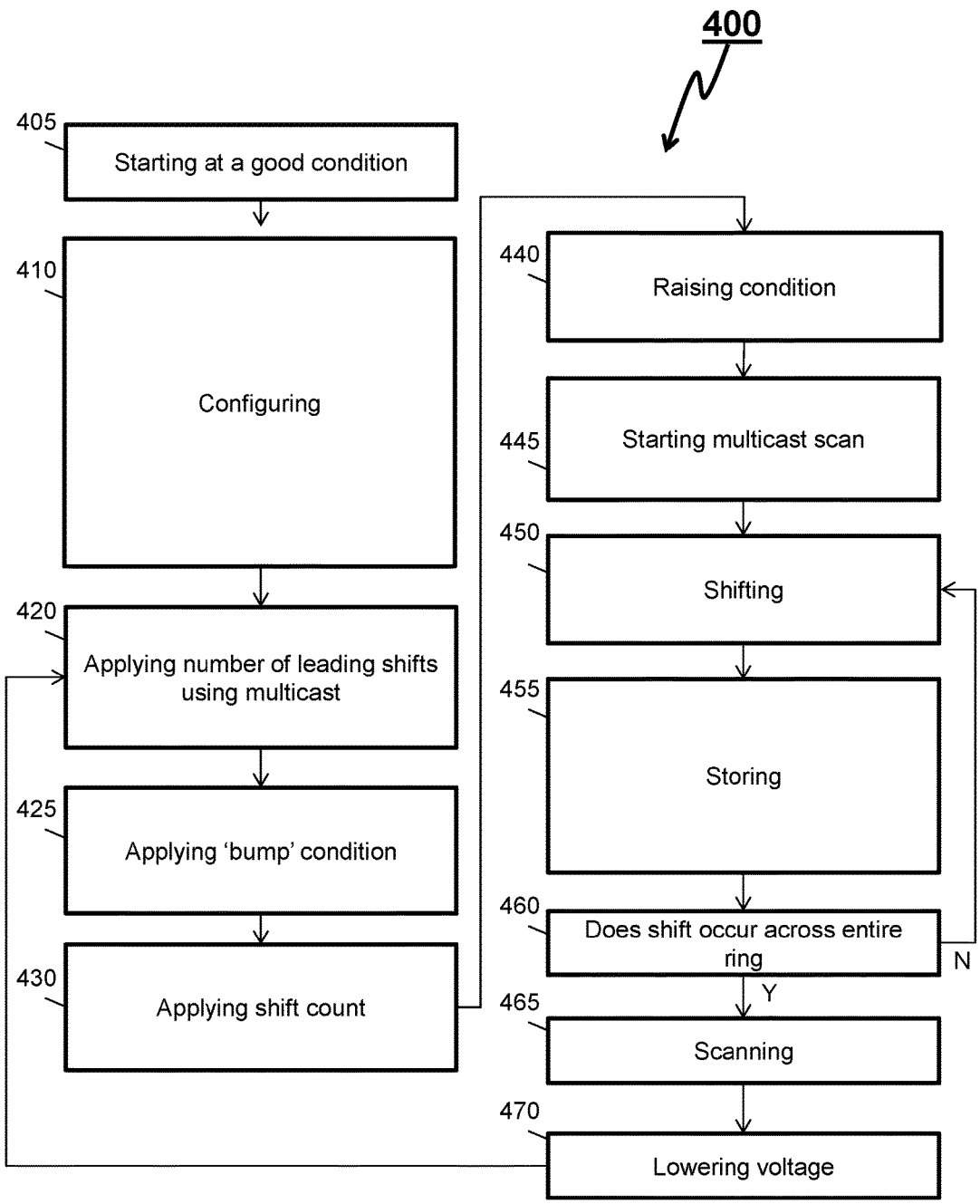
FIG. 4 illustrates another process flow of a diagnosis system in accordance with another embodiment.

FIG. 4 illustrates a process flow 400 of a diagnosis system without an automatic slave fail bit in accordance with an embodiment. The process flow 400 can be an all (parallel) scan chain mode that begins at block 405. At block 405, the diagnosis system starts at a known good condition within an integrated circuit. That is, the diagnosis system locates a latch along a scan chain that is not broken.

At block 410, the diagnosis system configures the integrated circuit for a scan. The diagnosis system can set the integrated circuit for the scan (e.g., endpoint, clock controllers, etc.), set an internal clock frequency, and set a scan ratio. The diagnosis system can set a compare mask, comparison value, and comparison type. The diagnosis system can configure pervasive memory of the integrated circuit with an expect pattern.

At block 405, the diagnosis system applies number of leading shifts to the long scan (e.g., higher number can cause more overshoot of the fault location). At block 425, the diagnosis system applies bump condition (e.g., an external voltage, an internal clock via DPLL, scan-ratio, etc.).

At block 430, the diagnosis system applies shift count (e.g., multicast on all rings). At block 440, the diagnosis system can raise the good condition determined at block 405 (i.e., move the good condition along the single scan chain).

At block 445, the diagnosis system starts a multicast scan. For example, the diagnosis system performs a compare of multicast scan data with the expected data placed in pervasive memory. At block 450, the diagnosis system shifts a buffer width a number of cycles. During the shift, the target ring renders output data that is stored in the scan buffer. At block 455, if any bit does not compare, the diagnosis system stores a copy of the scan buffer in pervasive memory with the target ring identification and a total shift count.

At block 460, the diagnosis system determines whether shift occurs across entire ring. If a shift occurs across the entire ring, the process proceeds to block 465 (as indicated by the 'Y' Arrow). Otherwise, the process proceeds to block 450 (as indicated by the 'N' Arrow).

At block 465, the diagnosis system scans only fail data out of chip. At block 470, the diagnosis system lowers voltage. The process 400 can then repeat by proceeding to block 420.

Figure 5:
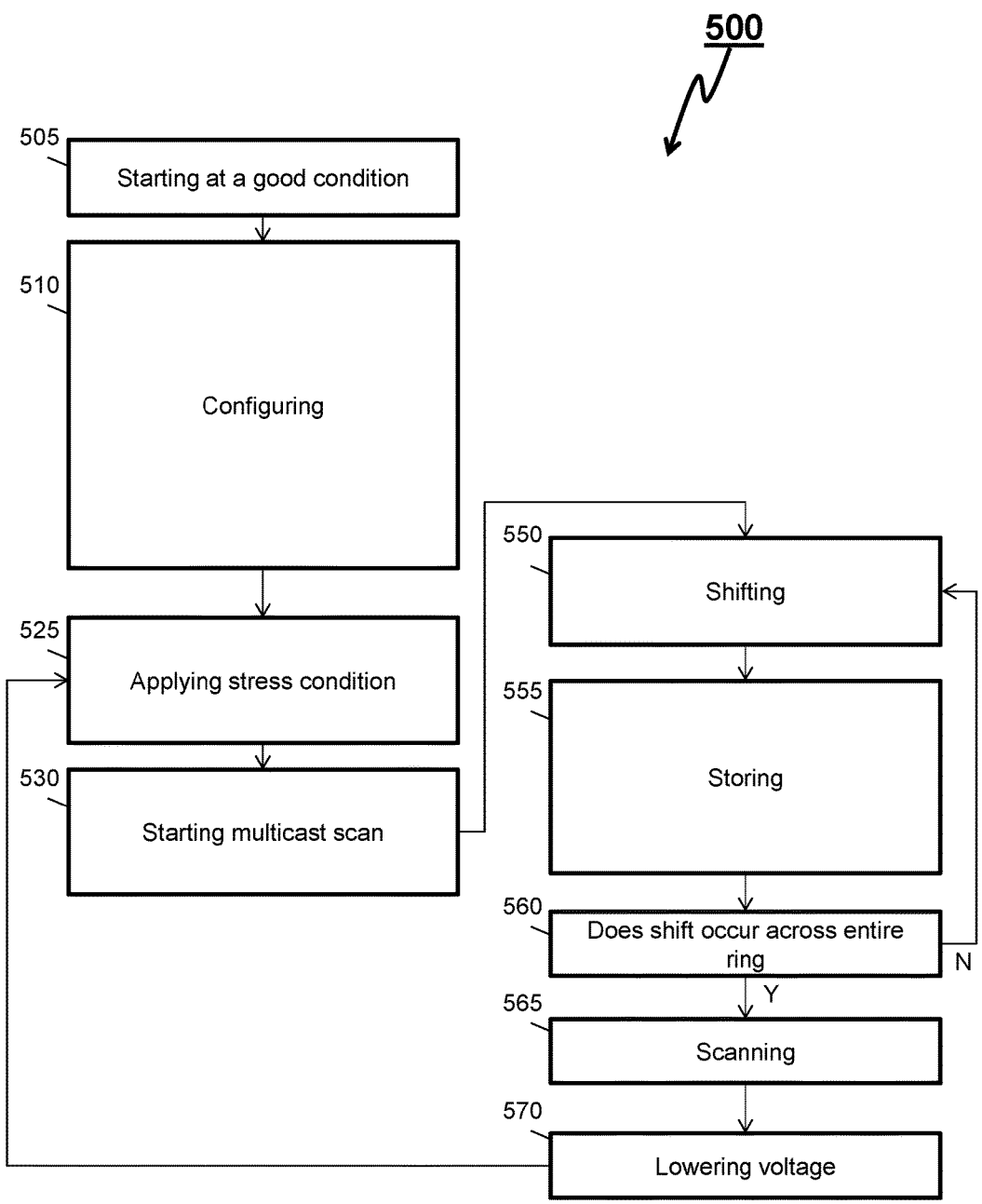
FIG. 5 illustrates another process flow of a diagnosis system in accordance with another embodiment.

FIG. 5 illustrates a process flow 500 of diagnosis system with noise generation in accordance with another embodiment. The diagnosis system executing the process flow 500 utilizes the principles of an integrated circuit being intrinsically noisy and chain tests being overly quiet to isolate the fault locations. The process flow 500 begins at block 505. At block 505, the diagnosis system starts at a known good condition within an integrated circuit. That is, the diagnosis system locates a latch along the single scan chain that is not broken to identify a target ring.

At block 510, the diagnosis system configures the integrated circuit for a scan. The diagnosis system can set the integrated circuit for the scan (e.g., endpoint, clock controllers, etc.), set an internal clock frequency, and set a scan ratio. The diagnosis system can set a compare mask, comparison value, and comparison type. The diagnosis system can configure pervasive memory of the integrated circuit with an expect pattern. Note that each expected pattern produces a different noise profile, and how the noise profiles aligns indicates fault locations.

At block 525, the diagnosis system applies stress condition (e.g., internal clock via DPLL, scan-ratio, etc.). Stress conditions are programmed as a sequence of events to produce desired noise and diagnostic isolation. For example, in an aggressor/victim mode, shift neighboring rings in parallel and align completion of that with victim shifts. At block 530, the diagnosis system starts a multicast scan. For example, the diagnosis system performs a compare of multicast scan data with the expected data placed in pervasive memory.

At block 550, the diagnosis system shifts a buffer width a number of cycles. During the shift, the target ring renders output data that is stored in the scan buffer. At block 555, if any bit does not compare, the diagnosis system stores a copy of the scan buffer in pervasive memory with the target ring identification and a total shift count.

At block 560, the diagnosis system determines whether shift occurs across entire ring. If a shift occurs across the entire ring, the process proceeds to block 565 (as indicated by the 'Y' Arrow). Otherwise, the process proceeds to block 550 (as indicated by the 'N' Arrow).

At block 565, the diagnosis system scans only fail data out of chip. At block 570, the diagnosis system lowers voltage. The process 500 can then repeat by proceeding to block 520.

Figure 6:
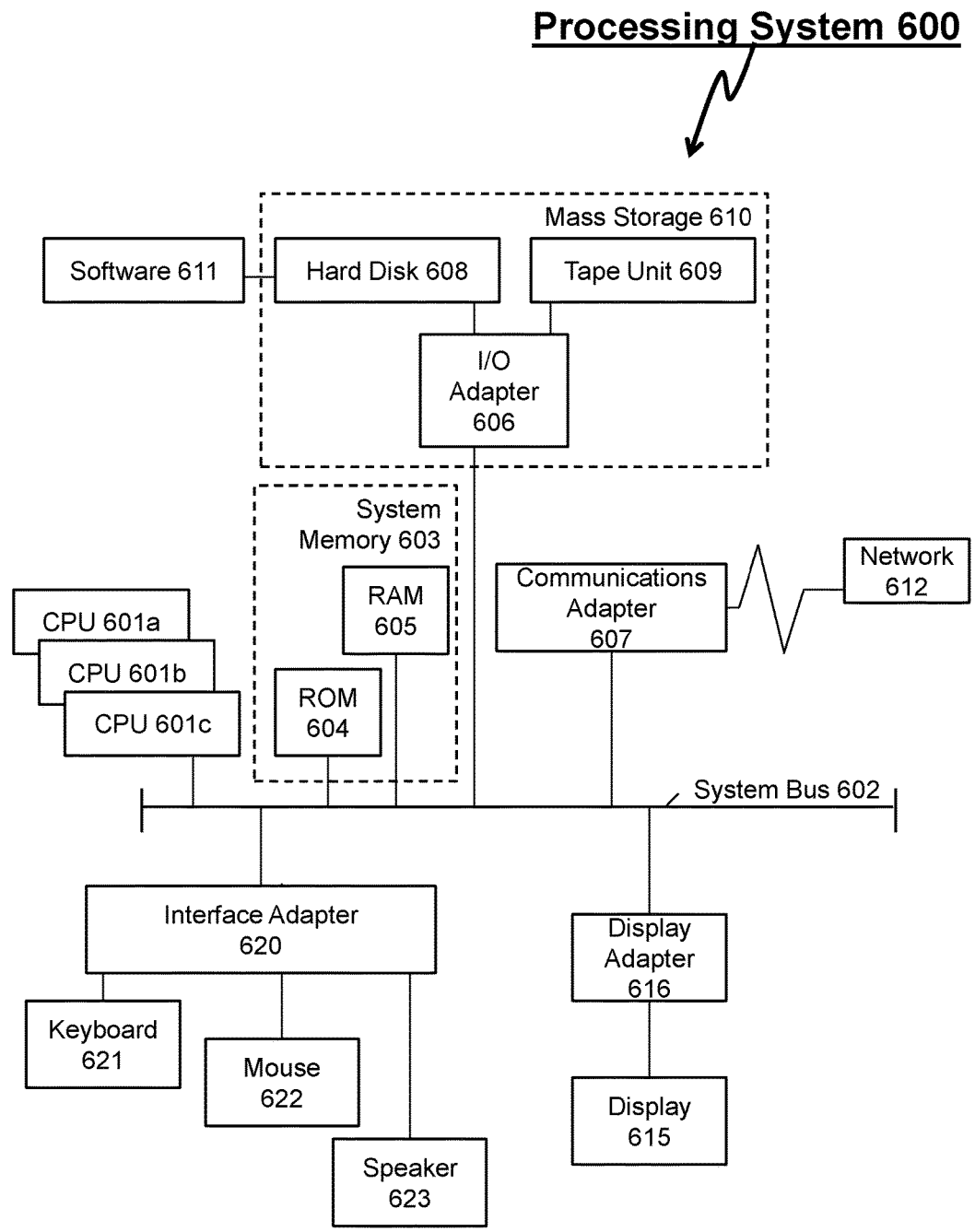
FIG. 6 illustrates a processing system in accordance with an embodiment.

Referring now to FIG. 6, there is shown an embodiment of a processing system 600 for implementing the teachings herein. In this embodiment, the processing system 600 has one or more central processing units (CPU(s)) 601a, 601b, 601c, etc. (collectively or generically referred to as processor(s) 601). The processors 601, also referred to as processing circuits, are coupled via a system bus 602 to system memory 603 and various other components. The system memory 603 can include a read only memory (ROM) 604 and a random access memory (RAM) 605. The ROM 604 is coupled to system bus 602 and may include a basic input/output system (BIOS), which controls certain basic functions of the processing system 600. The RAM is read-write memory coupled to the system bus 602 for use by the processors 601.

FIG. 6 further depicts an input/output (I/O) adapter 606 and a communications adapter 607 coupled to the system bus 602. The I/O adapter 606 may be a small computer system interface (SCSI) adapter that communicates with a hard disk 608 and/or tape unit (tape storage drive) 609 or any other similar component. The I/O adapter 606, the hard disk 608, and the tape unit 609 are collectively referred to herein as a mass storage 610. A software 611 for execution on the processing system 600 may be stored in the mass storage 610. The mass storage 610 is an example of a tangible storage medium readable by the processors 601, where the software 611 is stored as instructions for execution by the processors 601 to perform a method, such as the process flows of FIGS. 2-5. A communications adapter 607 interconnects the system bus 602 with a network 612, which may be an outside network, enabling the processing system 600 to communicate with other such systems. A display (e.g., screen, a display monitor) 615 is connected to the system bus 602 by a display adapter 616, which may include a graphics controller to improve the performance of graphics intensive applications and a video controller. In one embodiment, the adapters 606, 607, and 616 may be connected to one or more I/O buses that are connected to the system bus 602 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to the system bus 602 via an interface adapter 620 and the display adapter 616. A keyboard 621, a mouse 622, and a speaker 623 can be interconnected to the system bus 602 via the interface adapter 620, which may include, for example, a Super I/O chip integrating multiple device adapters into a single integrated circuit.

Thus, as configured in FIG. 6, the processing system 600 includes processing capability in the form of the processors 601, and, storage capability including the system memory 603 and the mass storage 610, input means such as the keyboard 621 and the mouse 622, and output capability including the speaker 623 and the display 615. In one embodiment, a portion of the system memory 603 and the mass storage 610 collectively store an operating system, such as the z/OS or AIX operating system from IBM Corporation, to coordinate the functions of the various components shown in FIG. 6.

Technical effects and benefits of a diagnosis system include allowing fast back to back test loops without full scan out (e.g., tester involvement) and allowing for field execution (e.g., firmware). Technical effects and benefits of a diagnosis system also include a direct isolation of a single latch, without logical insertions and/or tester involvement. Thus, embodiments described herein are necessarily rooted in processing system to perform proactive operations to overcome problems specifically arising in the realm of testing chip logic (e.g., these problems include the error prone, time consuming, or inaccurate operations, resulting in unwanted costs and expenses). For example, while contemporary implementation are non-optimal, the diagnosis system can create configurable noise creation to reduce separation between pure scan and functional/LBIST tests, which is highly useful when fails are due to a weakness in scanning ability versus actual functional operation.

Embodiments may include a system, a method, and/or a computer program product at any possible technical detail level of integration. The computer program product may include a computer readable storage medium (or media) having computer readable program instructions thereon for causing a processor to carry out aspects of the embodiments herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the embodiments herein may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN)

or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the embodiments herein.

Aspects of the embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of scanning of an integrated circuit comprising one or more chiplets to isolate one or more fault locations, comprising:
    providing, by a pervasive of the integrated circuit, an input to the one or more chiplets, each of the one or more chiplets comprising a pervasive satellite, at least one multiplexer, and one or more latches;
    scanning, by each pervasive satellite of the one or more chiplets, data based on the input via the at least one multiplexer into the one or more latches to produce scan data for each of the one or more chiplets; and
    comparing, by the pervasive of the integrated circuit, the scan data of each of the one or more chiplets to expectant data stored on the pervasive to isolate the one or more fault locations,
    wherein the scanning of the data is executed in parallel across the one or more chiplets,
    wherein the scan data comprises scan signals produces by a clock of the integrated circuit, and
    wherein the clock generates high frequency noise or a low to middle frequency noise configurable by customizing the data.

2. The method of claim 1, comprising performing a save operation that stores the scan data in the pervasive for unloading.

3. The method of claim 1, comprising causing scan shifts to be performed in the one or more chiplets across the one or more latches.

4. The method of claim 1, wherein the data comprises stress conditions programmed as a sequence of events to produce desired noise and diagnostic isolation as the scan data.

5. A computer program product, the computer program product comprising a computer readable storage medium having program instructions scanning of an integrated circuit comprising one or more chiplets to isolate one or more fault locations embodied therewith, the program instructions executable by a pervasive of the integrated circuit to cause:
    providing, by the pervasive of the integrated circuit, an input to the one or more chiplets, each of the one or more chiplets comprising a pervasive satellite, at least one multiplexer, and one or more latches;
    scanning, by each pervasive satellite of the one or more chiplets, data based on the input via the at least one multiplexer into the one or more latches to produce scan data for each of the one or more chiplets; and comparing, by the pervasive of the integrated circuit, the scan data of each of the one or more chiplets to expectant data stored on the pervasive to isolate the one or more fault locations, wherein the scanning of the data is executed in parallel across the one or more chiplets, wherein the scan data comprises scan signals produces by a clock of the integrated circuit, and wherein the clock generates high frequency noise or a low to middle frequency noise configurable by customizing the data.

6. The computer program product of claim 5, wherein the program instructions are further executable by the pervasive to cause performing a save operation that stores the scan data in the pervasive for unloading.

7. The computer program product of claim 5, wherein the program instructions are further executable by the pervasive to cause causing scan shifts to be performed in the one or more chiplets across the one or more latches.

8. The computer program product of claim 5, wherein the data comprises stress conditions programmed as a sequence of events to produce desired noise and diagnostic isolation as the scan data.

9. A system, comprising a processor and a memory storing program instructions scanning of an integrated circuit comprising one or more chiplets to isolate one or more fault locations thereon, the program instructions executable by a processor to cause the system to perform:

providing, by the pervasive of the integrated circuit, an input to the one or more chiplets, each of the one or more chiplets comprising a pervasive satellite, at least one multiplexer, and one or more latches;

scanning, by each pervasive satellite of the one or more chiplets, data based on the input via the at least one multiplexer into the one or more latches to produce scan data for each of the one or more chiplets; and comparing, by the pervasive of the integrated circuit, the scan data of each of the one or more chiplets to expectant data stored on the pervasive to isolate the one or more fault locations, wherein the scanning of the data is executed in parallel across the one or more chiplets, wherein the scan data comprises scan signals produces by a clock of the integrated circuit, and wherein the clock generates high frequency noise or a low to middle frequency noise configurable by customizing the data.

10. The system of claim 9, wherein the program instructions are further executable by the pervasive to cause performing a save operation that stores the scan data in the pervasive for unloading.

11. The system of claim 9, wherein the program instructions are further executable by the pervasive to cause causing scan shifts to be performed in the one or more chiplets across the one or more latches.

* * * * *